(12) United States Patent
Saito et al.

(10) Patent No.: US 12,050,184 B2
(45) Date of Patent: Jul. 30, 2024

(54) MASK INSPECTION METHOD AND MASK INSPECTION APPARATUS

(71) Applicant: Lasertec Corporation, Kanagawa (JP)

(72) Inventors: Keita Saito, Yokohama (JP); Haruhiko Kusunose, Yokohama (JP); Tsunehito Kohyama, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 414 days.

(21) Appl. No.: 17/643,151

(22) Filed: Dec. 7, 2021

(65) Prior Publication Data

US 2022/0178847 A1 Jun. 9, 2022

(30) Foreign Application Priority Data

Dec. 7, 2020 (JP) ................. 2020-202434

(51) Int. Cl.
*G01N 21/95* (2006.01)
*G01N 21/956* (2006.01)

(52) U.S. Cl.
CPC . *G01N 21/956* (2013.01); *G01N 2021/95676* (2013.01)

(58) Field of Classification Search
CPC ............. G01N 21/956; G01N 2021/95676
See application file for complete search history.

(56) References Cited

U.S. PATENT DOCUMENTS

| 2008/0260282 | A1* | 10/2008 | Hasegawa | G06T 5/92 |
| | | | | 382/260 |
| 2011/0304848 | A1 | 12/2011 | Tanaka et al. | |
| 2017/0187943 | A1* | 6/2017 | Tsuyuki | H04N 23/76 |
| 2018/0012098 | A1* | 1/2018 | Mizuno | H04N 19/63 |

FOREIGN PATENT DOCUMENTS

| JP | 2010256340 A | 11/2010 |
| JP | 2014093616 A | 5/2014 |

* cited by examiner

*Primary Examiner* — Nicole M Ippolito
(74) *Attorney, Agent, or Firm* — McCoy Russell LLP

(57) ABSTRACT

Resolution is improved in a required direction while maintaining contrast in inspection of an anamorphic mask. A method for inspecting a mask with a reduction rate at the time of exposure in a longitudinal direction different from a reduction rate at the time of exposure in a lateral direction according to the present disclosure includes capturing an image of the mask using a photodetector including a rectangular pixel, a ratio of a dimension of the rectangular pixel in the longitudinal direction to a dimension of the rectangular pixel in the lateral direction being equal to an inverse ratio of the reduction rate in the longitudinal direction to the reduction rate in the lateral direction.

7 Claims, 5 Drawing Sheets

MASK INSPECTION METHOD AND MASK INSPECTION APPARATUS

CROSS REFERENCE TO RELATED APPLICATION

The present application claims priority to Japanese Patent Application No. 2020-202434 filed on Dec. 7, 2020. The entire contents of the above-listed application is hereby incorporated by reference for all purposes.

TECHNICAL FIELD

The present disclosure relates to a mask inspection method and a mask inspection apparatus.

BACKGROUND

An imaging system using a Time Delay Integration (TDI) camera is useful in semiconductor inspection, because it can obtain a high resolution and high contrast image. Japanese Unexamined Patent Application Publication Nos. 2010-256340 and 2014-93616 disclose a technique for inspecting semiconductors using a TDI camera.

Japanese Unexamined Patent Application Publication No. 2010-256340 discloses a technique for inspecting an object to be inspected using a TDI sensor having pixels of a shape corresponding to a scanning speed of a stage and a line rate of the TDI sensor. Japanese Unexamined Patent Application Publication No. 2014-93616 discloses a technique for increasing the number of TDI stages in a digital TDI sensor.

In Extreme Ultraviolet (EUV) exposure, it has been proposed that a reduction rate (<1) at the time of reduction projection of a mask pattern on a wafer in a scanning direction of a mask is made different from that in a direction orthogonal to the scanning direction. Such a mask is also called an anamorphic mask, and a pattern width in a longitudinal direction and a pattern width in a lateral direction are asymmetric.

When a mask is inspected, it is necessary to increase the resolution of imaging in order to detect smaller defects thereof. However, when the pixel size of the TDI sensor is reduced, a light receiving area per pixel is reduced and an amount of light received is also reduced. Therefore, when an inspection time, i.e., exposure time, remains unchanged, there has been a problem that the signal-to-noise ratio (S/N) deteriorates, and it is thus difficult to maintain the contrast.

SUMMARY

An object of the present disclosure is to provide a mask inspection method and a mask inspection apparatus capable of improving resolution in a required direction while maintaining contrast in inspection of an anamorphic mask.

An example aspect of the present disclosure is a method for inspecting a mask with a reduction rate at the time of exposure in a longitudinal direction different from a reduction rate at the time of exposure in a lateral direction, the method including: capturing an image of the mask using a photodetector including a rectangular pixel, a ratio of a dimension of the rectangular pixel in the longitudinal direction to a dimension of the rectangular pixel in the lateral direction being equal to an inverse ratio of the reduction rate in the longitudinal direction to the reduction rate in the lateral direction.

Another example aspect is a mask inspection apparatus for inspecting a mask with a reduction rate at the time of exposure in a longitudinal direction different from a reduction rate at the time of exposure in a lateral direction. The mask inspection apparatus includes a photodetector including a rectangular pixel, a ratio of a dimension of the rectangular pixel in the longitudinal direction to a dimension of the rectangular pixel in the lateral direction being equal to an inverse ratio of the reduction rate in the longitudinal direction to the reduction rate in the lateral direction.

According to the present disclosure, it is possible to provide a mask inspection method and a mask inspection apparatus capable of improving resolution in a required direction while maintaining contrast in inspection of an anamorphic mask.

The above and other objects, and features of the present disclosure will become more fully understood from the detailed description given hereinbelow and the accompanying drawings which are given by way of illustration only, and thus are not to be considered as limiting the present disclosure.

DETAILED DESCRIPTION

Hereinafter, a specific configuration of this embodiment will be described with reference to the drawings. The following description shows some embodiments of the present disclosure, and the scope of the present disclosure is not limited to the following embodiments. In the following description, the same reference signs denote substantially the same contents.

A mask inspection apparatus according to this embodiment performs inspection based on an image obtained by capturing an image of a mask. The inspection apparatus inspects a photomask in which a fine pattern is formed. The inspection apparatus inspects masks whether or not there is a defect such as a foreign matter adhering to the masks.

Figure 1:
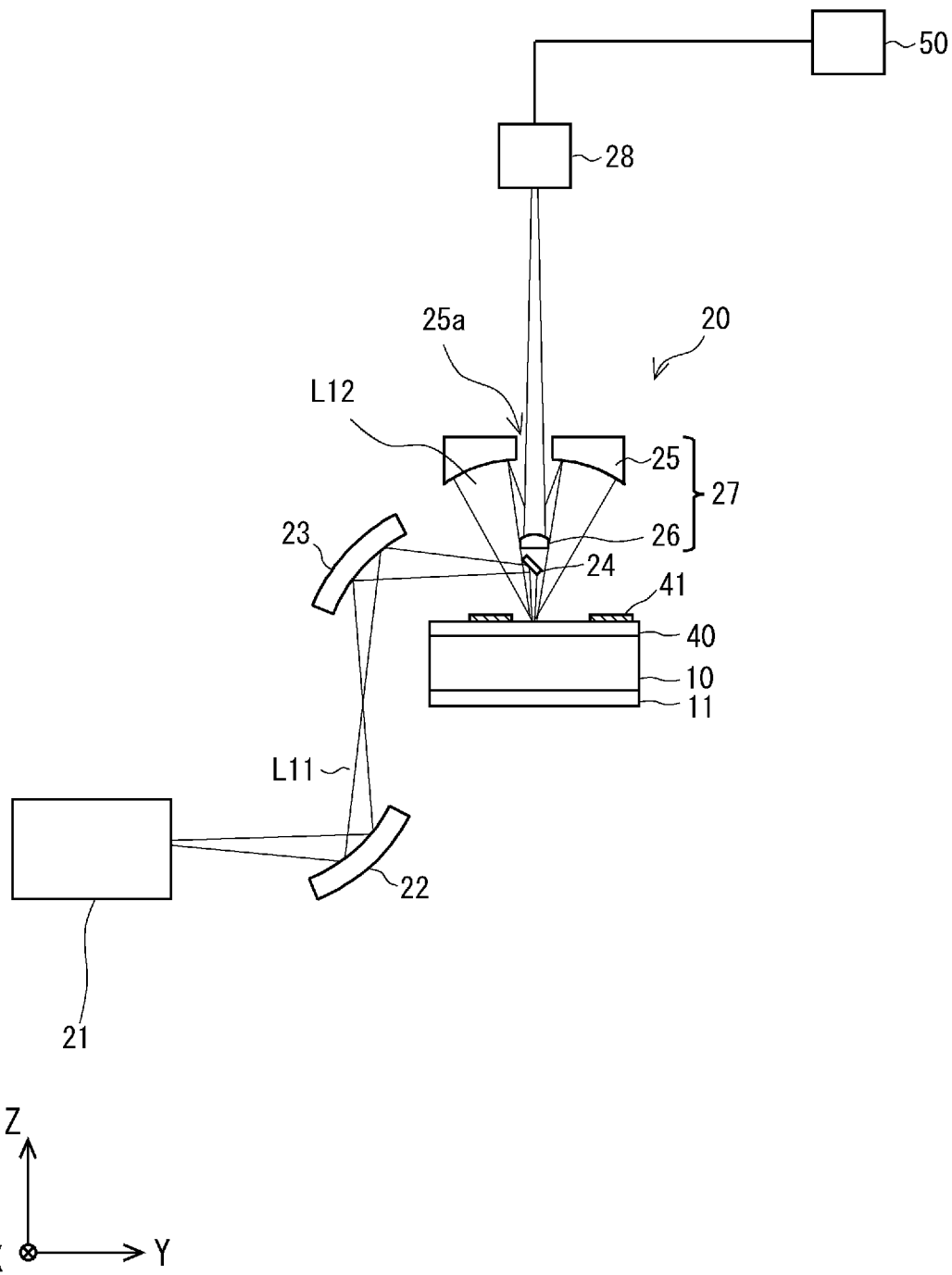
FIG. 1 is a schematic diagram showing an overall configuration of a mask inspection apparatus according to an embodiment.

The inspection apparatus according to this embodiment will be described with reference to FIG. 1. FIG. 1 schematically shows an entire configuration of an inspection apparatus 100. The inspection apparatus 100 includes a stage 10, an imaging optical system 20, and a processing apparatus 50. The processing apparatus 50 is a computer including a processor and a memory.

FIG. 1 shows a three-dimensional orthogonal coordinate system of XYZ for clarity of explanation. A Z direction is a vertical direction and parallel to a thickness direction of a mask 40. Thus, the Z direction is a height direction. A pattern 41 such as a light shielding film is formed on an upper surface of the mask 40. The Z direction is a normal direction of a pattern forming surface, i.e., a main surface, of the mask 40. A X direction and a Y direction are horizontal and parallel to the pattern direction of the mask 40. The Z direction is the thickness direction of the mask 40. Since the mask 40 is a photomask, it is a rectangular glass substrate.

The X direction and the Y direction are parallel to edge sides of the mask 40. The X direction and the Y direction are also referred to as a lateral direction and a longitudinal direction, respectively.

The mask 40, an image of which is to be captured, is placed on the stage 10. As described above, the mask 40 is a photomask and is held on the stage 10. The mask 40 is held parallel to the XY plane on stage 10. The stage 10 is a three-dimensional driving stage having a driving mechanism 11. The processing apparatus 50 controls the driving mechanism 11 to drive the stage 10 in the XYZ direction.

The mask 40 is a mask called an anamorphic mask. A reduction rate (<1) of the mask 40 at the time of exposure in the lateral direction, which is the X direction, differs from that in the longitudinal direction, which is the Y direction. For example, the reduction rate Mx (<1) in the lateral direction, which is the X direction, may be ¼, and the reduction rate My (<1) in the longitudinal direction, which is the Y direction, may be ⅛.

Figure 2:
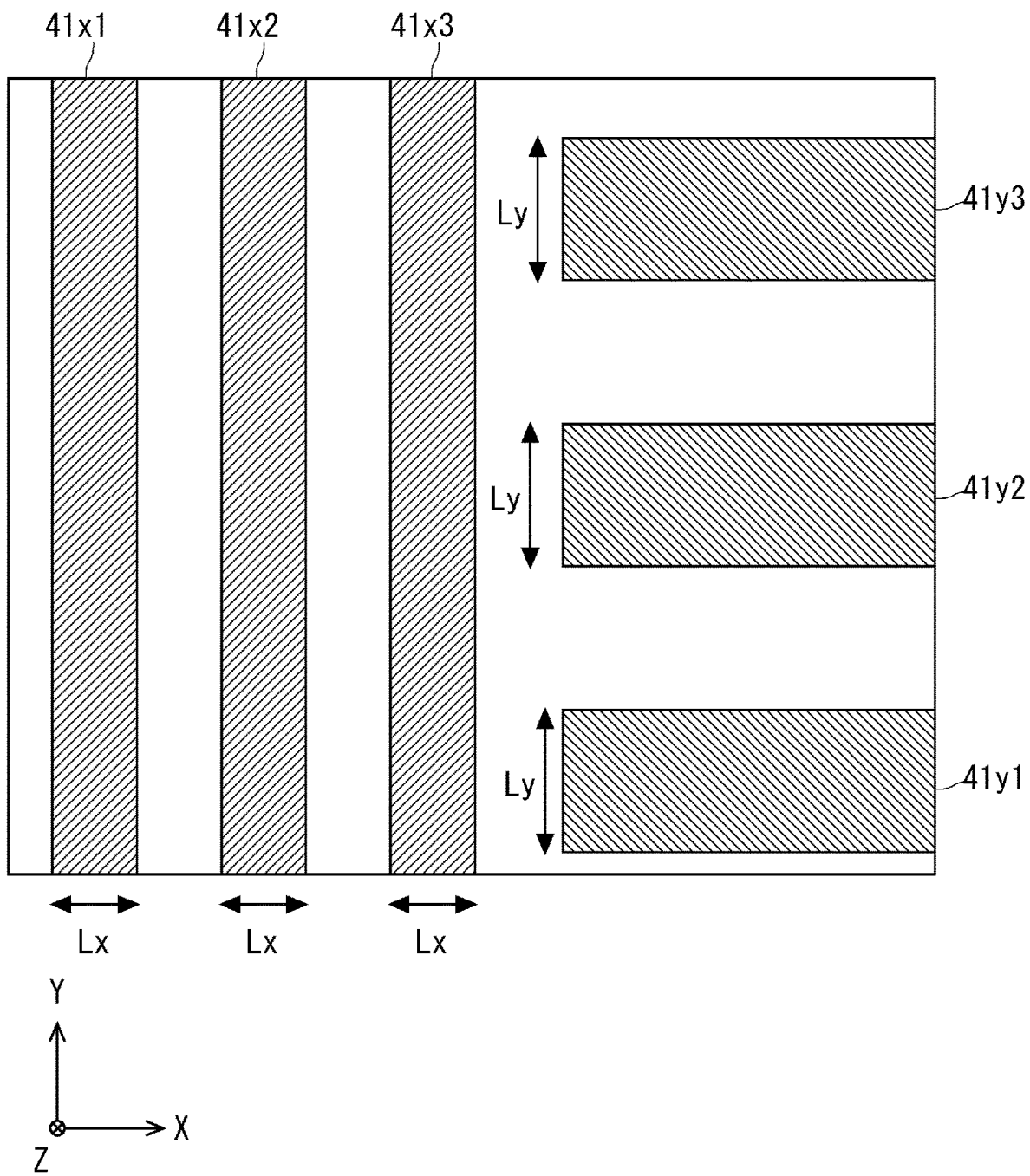
FIG. 2 is a schematic diagram showing an example of a pattern of a mask to be inspected.

Referring to FIG. 2, the pattern 41 on the mask 40 will be described. FIG. 2 is a schematic diagram showing an example of the pattern 41. The pattern 41 includes patterns 41x1, 41x2, and 41x3. Each of the patterns 41x1, 41x2, and 41x3 has a width Lx. The width Lx is also referred to as a pattern width in the X direction. The pattern 41 includes patterns 41y1, 41y2, and 41y3. Each of the patterns 41y1, 41y2, and 41y3 has a width Ly. The width Ly is also referred to as a pattern width in the Y direction. When the reduction rate Mx (<1) is ¼ and the reduction rate My (<1) is ⅛, the ratio of the width Lx to the width Ly is 1:2. That is, the ratio of the width Lx to the width Ly is an inverse ratio, i.e., a ratio of the reciprocals (e.g., 4 to 8) of the reduction rate. Thus, when the exposure is performed with the reduction rate Mx set to ¼ and the reduction rate My set to ⅛, a pattern having the same width in the X direction as that in the Y direction is transferred to the wafer. For example, if Lx is 64 nm and Ly is 128 nm, a pattern having a width of 16 nm in both the X and Y directions will be transferred to the wafer.

As described above, in the anamorphic mask, the pattern width in the direction in which the reduction rate (<1) is large, namely, the X direction in FIG. 2, is smaller than the pattern width in the direction in which the reduction rate (<1) is small, namely, the Y direction in FIG. 2. Thus, the pattern width in the direction in which the reciprocal of the reduction rate (<1) is small, namely, the X direction in FIG. 2, requires inspection with higher resolution. Further, in the direction in which the reduction rate (<1) is small, a defect is also transferred in a more reduced size, and therefore, there is a possibility that high-precision inspection is not required.

The pattern 41 shown in FIG. 2 is merely an example. Since the reduction rates Mx and My are not limited to ¼ and ⅛, respectively, the ratio of the width Lx to the width Ly is not limited to 1:2. The pattern in the X direction and the pattern in the Y direction may intersect with each other. The pattern 41 is not limited to a linear pattern, and instead may be a rectangular pattern. In such a case, the length of the rectangle in the X direction may be the width Lx, and the length of the rectangle in the Y direction may be the width Ly. The pattern 41 may include obliquely extending lines or curves.

Returning to FIG. 1, the imaging optical system 20 includes a light source 21, a concave mirror 22, a concave mirror 23, a dropping mirror 24, and a Schwarzschild optical system 27. The imaging optical system 20 is a dark-field optical system for capturing an image of the mask 40. In the imaging optical system 20, irradiation light L11 may be incident obliquely downward on the mask 40. In such a case, detection light L12 travels obliquely upward.

The imaging optical system 20 shown in FIG. 1 is simplified as appropriate. The imaging optical system 20 may further include an optical element, a lens, an optical scanner, a mirror, a filter, a beam splitter, or the like in addition to the above components. Although FIG. 1 shows a reflection optical system for performing a high-precision inspection by EUV light, the inspection apparatus 100 may perform the inspection using light other than EUV light. In such a case, the imaging optical system 20 may be a transmission optical system.

The light source 21 generates irradiation light L11. The irradiation light L11 is, for example, EUV light having a wavelength of 13.5 nm which is the same as the exposure wavelength. The irradiation light L11 is not limited to EUV light, and instead may include UV light, visible light, etc. The light source 21 may be a lamp light source, a Light Emitting Diode (LED) light source, or a laser light source. The irradiation light L11 generated by the light source 21 proceeds as spreading out. The irradiation light L11 generated from the light source 21 is reflected by the concave mirror 22. The concave mirror 22 is, for example, a spheroidal mirror. The concave mirror 22 is a multilayer mirror formed by alternately laminating Mo films and Si films, and reflects EUV light. The irradiation light L11 reflected by the concave mirror 22 proceeds as being narrowed down. The irradiation light L11 is focused and then proceeds as spreading out. Then, the irradiation light L11 is reflected by the concave mirror 23.

The concave mirror 23 is, for example, a spheroidal mirror. The concave mirror 23 is a multilayer mirror formed by alternately laminating Mo films and Si films, and reflects EUV light. The irradiation light L11 reflected by the concave mirror 23 proceeds as being narrowed down, and then is incident on the dropping mirror 24. The irradiation light L11 reflected by the dropping mirror 24 is then incident on the mask 40. The dropping mirror 24 concentrates the irradiation light L11 on the mask 40. In this way, an inspection area of the mask 40 is illuminated by the irradiation light L11 which is EUV light. Therefore, the irradiation light L11 becomes illumination light for illuminating the mask 40.

The detection light L12 reflected by the mask 40 is incident on a concave mirror 25 with a hole. A hole 25a is formed at the center of the concave mirror 25 with a hole. The detection light L12 reflected by the concave mirror 25 with a hole is then incident on a convex mirror 26. The convex mirror 26 reflects the detection light L12 reflected from the concave mirror 25 with a hole toward the hole 25a of the concave mirror 25 with a hole. The detection light L12 which has passed through the hole 25a of the concave mirror 25 with a hole is incident on a photodetector 28. The inspection area of the mask 40 is magnified and projected on the photodetector 28 by the Schwarzschild optical system 27.

The photodetector 28 includes an imaging element for capturing an image of the mask 40. The photodetector 28 is a Charge Coupled Device (CCD) camera, a Complementary Metal Oxide Semiconductor (CMOS) sensor, or the like. The photodetector 28 detects the detection light L12 from the detection area illuminated by the irradiation light L11.

The photodetector 28 includes a plurality of rectangular pixels arranged in the X direction. The shape of the rectangular pixel will be described later. Here, a TDI sensor is used as the photodetector 28. The X direction is a line direction of the TDI sensor, and the Y direction is a transfer direction of the TDI sensor. The photodetector 28 captures an image of the mask 40 by transferring, in the Y direction, charges generated by the light received by each rectangular pixel. It is needless to say that the photodetector 28 is not limited to a TDI sensor. The photodetector 28 may be a line sensor in which a plurality of rectangular pixels are arranged in a row. The amount of light received by the photodetector 28 varies depending on the presence or absence of the pattern 41. The photodetector 28 outputs a detection signal corresponding to the amount of received light to the processing apparatus 50 for each rectangular pixel.

Next, the shape of the rectangular pixel provided in the photodetector 28 will be described. A ratio of a dimension lx, where l represents the letter L, of each rectangular pixel in the X direction to a dimension ly of each rectangular pixel in the Y direction is an inverse ratio of the reduction rate Mx of the mask 40 to the reduction rate My (<1) of the mask 40. For example, when the reduction rate Mx (<1) is ¼ and the reduction rate My (<1) is ⅛, the ratio of the dimension lx to the dimension ly is 1:2. Note that the ratio of the dimension of the rectangular pixel in the X direction to the dimension of the rectangular pixel in the Y direction is not limited to 1:2. When the reduction rate Mx (<1) is l/m and the reduction rate My (<1) is l/n, the ratio of the dimension lx to the dimension ly is m:n. Here, m and n are integers greater than or equal to 1 and m≠n.

Figure 3:
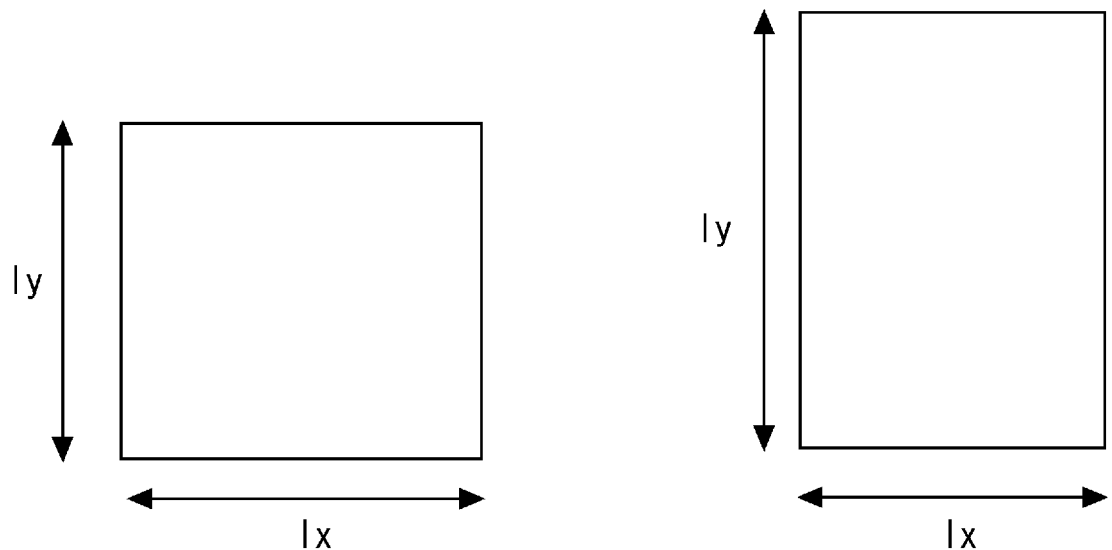
FIG. 3 is a schematic diagram showing an example of shapes of rectangular pixels.
Figure 3:
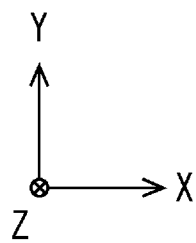

Next, a rectangular pixel 281 included in the photodetector 28 will be described in detail with reference to FIG. 3. The left side of FIG. 3 is a schematic view of a pixel used in a mask inspection apparatus of related art. The length of such a pixel in the X direction is 1 times a unit length l, and the length of such a pixel in the Y direction is 1 times the unit length l. The unit length l is, for example, 12 μm. On the other hand, the length lx of the rectangular pixel 281 included in the photodetector 28 in the X direction is ($\sqrt{2}/2$) times the unit length l, and the length ly of the rectangular pixel 281 included in the photodetector 28 in the Y direction is ($\sqrt{2}$) times the unit length l. Thus, a light receiving area of the rectangular pixel 281 is equal to a light receiving area of the pixel according to related art. By maintaining the light receiving area, it is possible to increase the resolution in the direction in which high resolution measurement is required while preventing deterioration of the S/N.

The ratio of the dimension lx to the dimension ly of the rectangular pixel 281 is equal to the ratio of the width Lx to the width Ly shown in FIG. 2. That is, it can be said that making the ratio of the dimension lx of the rectangular pixel 281 to the dimension ly of the rectangular pixel 281 be the inverse ratio of the reduction rate Mx (<1) to the reduction rate My (<1) is making the ratio of the dimension lx to the dimension ly be the ratio of the width Lx to the width Ly. It can thus be said that the rectangular pixel 281 has a small dimension in the direction in which the pattern width is small, namely, the direction in which high resolution is required.

Returning to FIG. 1, the stage 10 is a driving stage and can move the mask 40 in the XY direction. A drive control unit 52 (see FIG. 4) of the processing apparatus 50 controls the driving mechanism 11. The driving mechanism 11 relatively moves the detection area in the mask 40. When the drive control unit 52 moves the stage 10 in the XY direction, the position of the mask 40 illuminated by the irradiation light L11 can be changed.

Therefore, an image of any position of the mask 40 can be captured, and almost the entire surface of the mask 40 can be inspected. Needless to say, the drive control unit 52 may drive the imaging optical system 20 instead of the stage 10. That is, the relative position of the imaging optical system 20 with respect to the stage 10 may be movable. Alternatively, an optical scanner or the like may be used to scan with the irradiation light L11.

Specifically, the stage 10 can move the mask 40 in the Y direction. The irradiation light L11 illuminates, for example, a line-shaped area along the X direction in the mask 40. The direction in which the rectangular pixels are arranged in the photodetector 28 is the X direction. That is, the direction in which the rectangular pixels are arranged and the direction in which the stage 10 is driven are orthogonal to each other.

Figure 4:
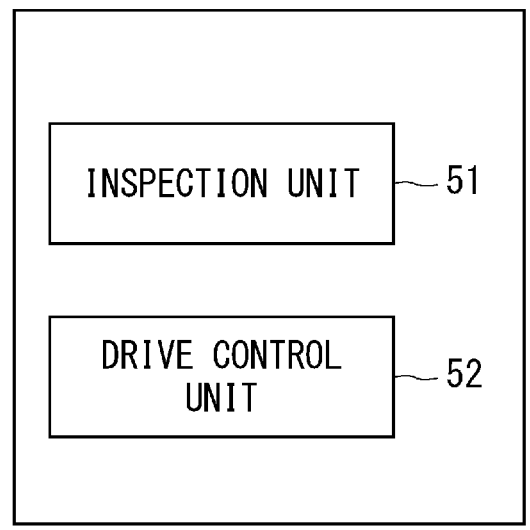
FIG. 4 is a control block diagram showing a configuration of a processing apparatus.

FIG. 4 is a block diagram showing a configuration of the processing apparatus 50. The processing apparatus 50 includes an inspection unit 51 and a drive control unit 52. The inspection unit 51 acquires an image captured by the photodetector 28, and inspects the mask 40 using the captured image. The captured image includes pattern information of the inspection area, and the inspection unit 51 analyzes the pattern based on the captured image to detect a defect. Various kinds of processing can be used for the processing in the inspection unit 51 in the same manner as in the related art. The inspection unit 51 may inspect defects, for example, by comparing the luminance of the captured image with a threshold. The inspection unit 51 may inspect the mask by a comparative inspection between a reference sample and the mask 40.

For example, the inspection unit 51 obtains a difference value between the luminance of the reference image and that of the captured image, and compares the difference value with a threshold. The inspection unit 51 detects a defect such as pattern abnormality and a foreign matter based on a result of the comparison between the difference value and the threshold. That is, the difference value becomes larger than the threshold at the defective part where a foreign matter or the like adheres. The inspection unit 51 outputs the defective part and its position coordinates in association with each other. The position coordinates of the defective part are specified by a position driven by the drive control unit 52. The inspection unit 51 obtains XY coordinates of the defective part in the inspection area based on a position where the stage 10 is driven and pixel positions in the photodetector 28. The drive control unit 52 controls the stage 10 as described above.

Figure 5:
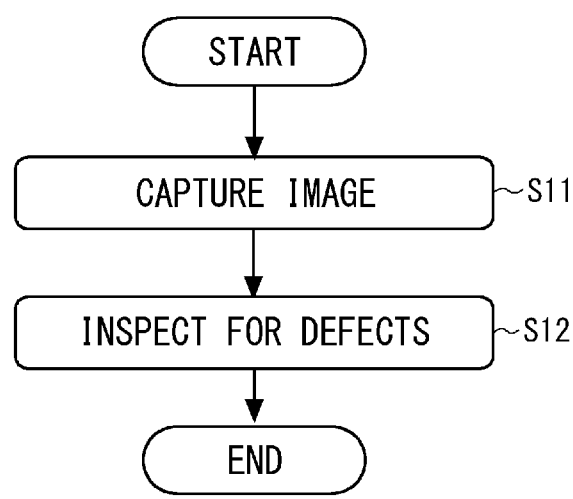
FIG. 5 is a flowchart showing a flow of a mask inspection method according to the embodiment.

FIG. 5 is a flowchart showing an example of the flow of the mask inspection method according to the embodiment. It is assumed that the reference image of the mask 40 has been captured. First, the photodetector 28 having rectangular pixels is used to capture an image of the mask 40 (Step S11). Next, the image captured in Step S101 is compared with the reference image, and a defect such as a foreign matter on the mask 40 is detected according to a result of the comparison (Step S12). If the defect is detected by the inspection, the photomask may be cleaned or modified.

The effect of the disclosure according to the embodiment will be described. In EUV masks, which are said to be the high-NA generation in the future, a reduction rate (<1) in the longitudinal direction is different from a reduction rate (<1) in the lateral direction. In the rectangular pixel of the inspection apparatus according to the embodiment, the ratio of the dimensions in each direction is the inverse ratio of the reduction rate (<1) in each direction. Therefore, the pixel size is small in the direction in which the reduction rate (<1) is large and the high-resolution inspection is required, and the pixel size is large in the direction in which the reduction rate (<1) is small and the high-resolution inspection is not required. Therefore, the inspection apparatus according to the embodiment makes it possible to perform a high-resolution inspection in a required direction while preventing a decrease in contrast and an increase in an inspection time due to a decrease in a light receiving area.

While the embodiments of the present disclosure have been described above, the present disclosure includes appropriate modifications without detriment to the objects thereof, and is not limited by the embodiments described above.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion.

The invention claimed is:

1. A method for inspecting a mask with a reduction rate at the time of exposure in a longitudinal direction different from a reduction rate at the time of exposure in a lateral direction, the method comprising:
    capturing an image of the mask using a photodetector including a rectangular pixel, a ratio of a dimension of the rectangular pixel in the longitudinal direction to a dimension of the rectangular pixel in the lateral direction being equal to an inverse ratio of the reduction rate in the longitudinal direction to the reduction rate in the lateral direction.

2. The method according to claim 1, wherein the photodetector is a TDI sensor.

3. The method according to claim 1, wherein the ratio of the dimension of the rectangular pixel in the longitudinal direction to the dimension of the rectangular pixel in the lateral direction is m:n, m and n are integers greater than or equal to 1, and m≠n.

4. The method according to claim 1, wherein the mask includes a pattern, and a ratio of a pattern width of the pattern in the longitudinal direction to a pattern width of the pattern in the lateral direction is equal to the inverse ratio of the reduction rate in the longitudinal direction to the reduction rate in the lateral direction.

5. The method according to claim 1, wherein the image of the mask is captured using EUV light.

6. A mask inspection apparatus for inspecting a mask with a reduction rate at the time of exposure in a longitudinal direction different from a reduction rate at the time of exposure in a lateral direction, the mask inspection apparatus comprising:
    a photodetector including a rectangular pixel, a ratio of a dimension of the rectangular pixel in the longitudinal direction to a dimension of the rectangular pixel in the lateral direction being equal to an inverse ratio of the reduction rate in the longitudinal direction to the reduction rate in the lateral direction.

7. The mask inspection apparatus according to claim 6, wherein the photodetector is a TDI sensor.

* * * * *